(12) United States Patent
Liardet et al.

(10) Patent No.: US 8,554,813 B2
(45) Date of Patent: *Oct. 8, 2013

(54) CHECKING OF THE SKEW CONSTANCY OF A BIT FLOW

(75) Inventors: Pierre-Yvan Liardet, Peynier (FR); Yannick Teglia, Marseilles (FR)

(73) Assignee: STMicroelectronics S.A., Montrouge (FR)

( * ) Notice: Subject to any disclaimer, the term of this patent is extended or adjusted under 35 U.S.C. 154(b) by 561 days.

This patent is subject to a terminal disclaimer.

(21) Appl. No.: 12/852,853

(22) Filed: Aug. 9, 2010

(65) Prior Publication Data

US 2010/0325183 A1 Dec. 23, 2010

Related U.S. Application Data

(62) Division of application No. 11/166,564, filed on Jun. 24, 2005, now Pat. No. 7,827,222.

(30) Foreign Application Priority Data

Jun. 24, 2004 (FR) ...................................... 04 51324

(51) Int. Cl.
*G06F 7/58* (2006.01)
(52) U.S. Cl.
USPC ....................................................... 708/250
(58) Field of Classification Search
None
See application file for complete search history.

(56) References Cited

U.S. PATENT DOCUMENTS

| | | | |
|---|---|---|---|
| 3,582,882 A | 6/1971 | Titcomb et al. | |
| 3,961,169 A | 6/1976 | Bishop et al. | |
| 4,176,399 A | 11/1979 | Hoffmann et al. | |
| 4,853,884 A | 8/1989 | Brown et al. | |
| 5,778,069 A | 7/1998 | Thomlinson et al. | |
| 6,369,727 B1 | 4/2002 | Vincze | |
| 6,414,558 B1 | 7/2002 | Ryan et al. | |
| 6,430,170 B1 | 8/2002 | Saints et al. | |
| 6,456,737 B1 | 9/2002 | Woodfill et al. | |
| 6,727,765 B1 | 4/2004 | Ess | |
| 6,919,794 B2 | 7/2005 | Bardouillet et al. | |
| 7,590,673 B2 * | 9/2009 | Liardet et al. | 708/250 |
| 7,689,636 B2 * | 3/2010 | Liardet et al. | 708/250 |
| 7,734,672 B2 | 6/2010 | Liardet et al. | |
| 7,747,665 B2 * | 6/2010 | Liardet et al. | 708/250 |
| 7,827,222 B2 * | 11/2010 | Liardet et al. | 708/250 |
| 2002/0080965 A1 | 6/2002 | Marinet et al. | |
| 2002/0154767 A1 | 10/2002 | Endo et al. | |
| 2003/0200239 A1 | 10/2003 | Hars | |
| 2003/0219119 A1 | 11/2003 | Kocarev et al. | |
| 2004/0096060 A1 | 5/2004 | Henry et al. | |
| 2004/0263320 A1 | 12/2004 | Bardouillet et al. | |
| 2005/0050123 A1 * | 3/2005 | Liardet et al. | 708/250 |
| 2005/0050124 A1 * | 3/2005 | Liardet et al. | 708/250 |
| 2005/0050125 A1 * | 3/2005 | Liardet et al. | 708/250 |
| 2010/0325183 A1 * | 12/2010 | Liardet et al. | 708/250 |

OTHER PUBLICATIONS

Search Report from French Patent Application No. 04/51325, filed Jun. 24, 2004.

(Continued)

*Primary Examiner* — David H Malzahn
(74) *Attorney, Agent, or Firm* — Wolf, Greenfield & Sacks, P.C.

(57) ABSTRACT

A method and a circuit for detecting a loss in the equiprobable character of a first output bit flow originating from at least one first element of normalization of an initial bit flow, including analyzing the flow rate of the normalization element.

12 Claims, 2 Drawing Sheets

(56) References Cited

OTHER PUBLICATIONS

French Search Report from French Patent Application No. 04/51324, filed Jun. 24, 2004.
Bucci M. et al. "A High Speed Truly IC Random Number Source for Smart Card Microcontrollers" ICECS 2002, 9th IEEE International Conference on Electronics, Circuits and Systems, vol. 1, Sep. 15, 2002, pp. 239-242, XP010611765 Piscataway, NJ, US.
Takeuchi S. et al. "High Performance Random Pulser Based on Photon Counting" IEEE Transactions on Nuclear Scient, IEEE Inc., New York, US, vol. NS-33, No. 1, Feb. 1, 1986, pp. 946-969, XP002022448 ISSN: 0018-9499.

* cited by examiner

CHECKING OF THE SKEW CONSTANCY OF A BIT FLOW

RELATED APPLICATIONS

This application is a division of prior application Ser. No.: 11/166,564, filed on Jun. 24, 2005, entitled "Checking of the Skew Constancy of a Bit Flow", now U.S. Pat. No. 7,827,222, which claims the priority benefit of French patent application 04/51324, filed on Jun. 24, 2004, which applications are hereby incorporated by reference to the maximum extent allowable by law.

BACKGROUND OF THE INVENTION

1. Field of the Invention

The present invention relates to the field of random number generators and more specifically generators of random numbers in the form of bit flows originating from one or several digital or digitized noise sources.

2. Discussion of the Related Art

FIG. 1 very schematically shows in the form of blocks an example of a bit flow generator of the type to which the present invention applies.

Such a generator is based on the use of a noise source 1 (NS) providing an analog noise to an analog-to-digital conversion element 2 (A/D) clocked for example by a clock CLK and providing a bit flow BS. Source 1 is for example formed of one or several oscillators having their outputs summed up to provide an analog noise to the input of converter 2. Converter 2 may in simplified manner be an inverter associated with a flip-flop.

The quality of a random generator or more generally of a noise source is measured by the quality of its random character, which results in the equiprobability of the provided symbols, for example, the equiprobability of 0 and of 1 in the case where the source is considered bit by bit.

In practice, there may be a risk that the bit flow BS provided by converter 2 does not have an equiprobable distribution of its elements (bits or bit words). In particular, noise source 1 generally uses oscillators which risk synchronizing, together or with clock CLK. In case of a synchronization, the output state (bit flow) is periodic.

To improve the equiprobable character of a bit flow supposed to be random, bit flow BS crosses a normalization circuit 3 (NORM) providing a modified bit train NBS and having an improved equidistribution of the 0s and 1s in the flow.

FIG. 2 shows a conventional example of a circuit 3 for normalizing a bit flow BS applying a so-called Von Neumann method. Such a circuit 3 is based on an analysis of incoming bit flow BS, by bit pairs. A storage element 4 (BUFF) enabling processing the bits, in pairs, in a state determination circuit 5 which provides normalized bit flow NBS, is then used. According to the Von Neumann method, if the bit pair is 1-0, a state 1 is generated. If the bit pair is 0-1, a state 0 is generated. If the bit pair is 0-0 or 1-1, it is ignored, that is, no state is output. Other normalization methods exist, which may or may not apply the Von Neumann method.

A second example of normalization consists of calculating a parity bit over a predetermined length of the source and of only exploiting this parity bit. This method has been described in document RFC 1750 in December 1994.

In principle, the number of occurrences of 0 and 1 in flow BS is constant, which means that the noise source skew—or drift—is constant along time. Indeed, if this property is not respected on the noise source side, the normalization circuit does not have the expected effect of suppressing this drift in the bit flow.

The efficiency of a bit flow normalization circuit supposed to be random is particularly important since the random numbers are often used in ciphering applications or the like for which the loss of the random character of the number is a weakness.

A disadvantage of current normalized random number generators is that it is not known to check the elimination of a possible skew by the normalization circuit. This especially results from the fact that normalization methods only a priori assume, in their operation, that the noise source skew is constant.

A first problem is that if this skew becomes non constant, the bit flow provided by the normalization circuit no longer respects the desired equidistribution, without this being noticed.

A second problem is that an equidistribution over a great number of bits might be verified a posteriori at the output of a normalization circuit, but that it is not currently known to dynamically check this equiprobable character to rapidly detect a possible loss in the skew constancy in the noise source.

SUMMARY OF THE INVENTION

The present invention aims at checking the constancy of the skew of a bit flow provided by a normalization circuit and, in particular, at dynamically detecting a drift.

The present invention also aims at providing a solution compatible with conventional normalization methods and which, in particular, requires no modification of the actual random bit flow generation.

The present invention also aims at providing a simple implementation solution.

To achieve these and other objects, the present invention provides a circuit for generating a bit flow based on a noise source and on at least one first element for normalizing the initial bit flow provided by this noise source, comprising means for calculating the difference between the input and output flow rates of the normalization circuit.

The present invention also provides a circuit for generating a bit flow based on a noise source and on at least one first element for normalizing the initial bit flow provided by this noise source, comprising at least one second normalization element of the same noise source, of a different flow rate than the first element; and an element for calculating the difference between the respective flow rates of the two normalization elements.

According to an embodiment of the present invention, the circuit provides a bit for validating the equiprobable character of the output flow if said difference between the two flow rates remains within a predetermined range of values.

The present invention also provides a method for detecting a possible loss in the equiprobable character of a first output bit flow originating from at least one first element of normalization of an initial bit flow, said method comprising checking the constancy of the ratio of the rate of the output flow to the initial flow.

The present invention also provides a method for detecting a possible loss in the equiprobable character of a first output bit flow originating from at least one first element of normalization of an initial bit flow, said method comprising submitting the initial flow to at least one second flow rate normalization element different from the first one; and checking the constancy of the difference between the respective output flow rates.

According to an embodiment of the present invention, a loss in the equiprobable character of the output bit flow in case of a non-constant flow rate is considered.

According to an embodiment of the present invention, the method also comprises checking the constancy of the ratio of the rates of the output flow to the initial flow.

The foregoing and other objects, features, and advantages of the present invention will be discussed in detail in the following non-limiting description of specific embodiments in connection with the accompanying drawings.

DETAILED DESCRIPTION

Figure 1:
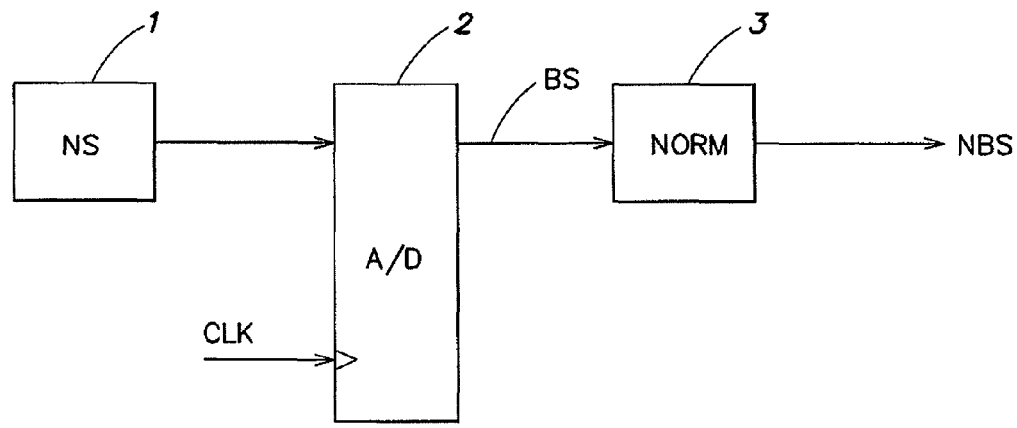
FIGS. 1 and 2, previously described, are intended to show the state of the art and the problem to solve.
Figure 2:
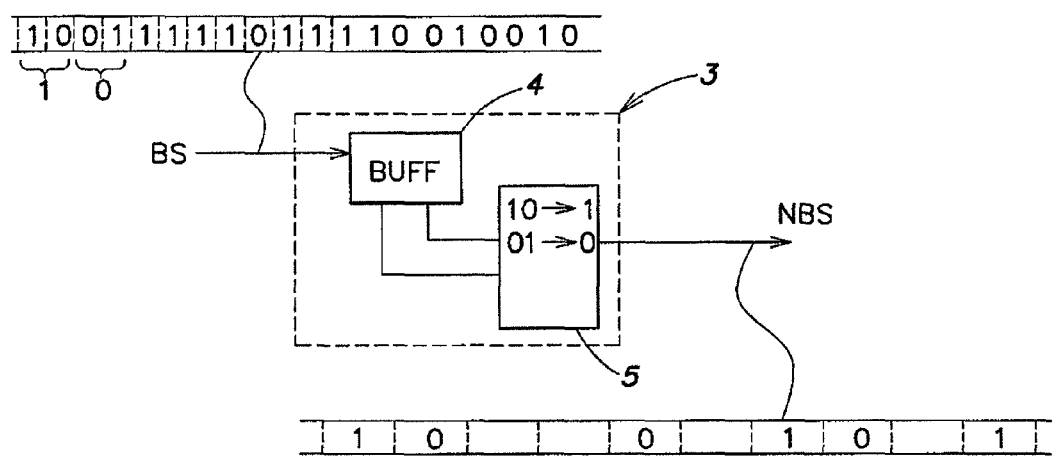

The same elements have been designated with the same reference numerals in the different drawings. For clarity, only those elements which are necessary to the understanding of the present invention have been shown in the drawings and will be described hereafter. In particular, the details constitutive of the normalization circuits, of the analog-to-digital converters, and of the noise source have not been discussed in detail, the present invention being compatible with any conventional implementation.

Figure 4:
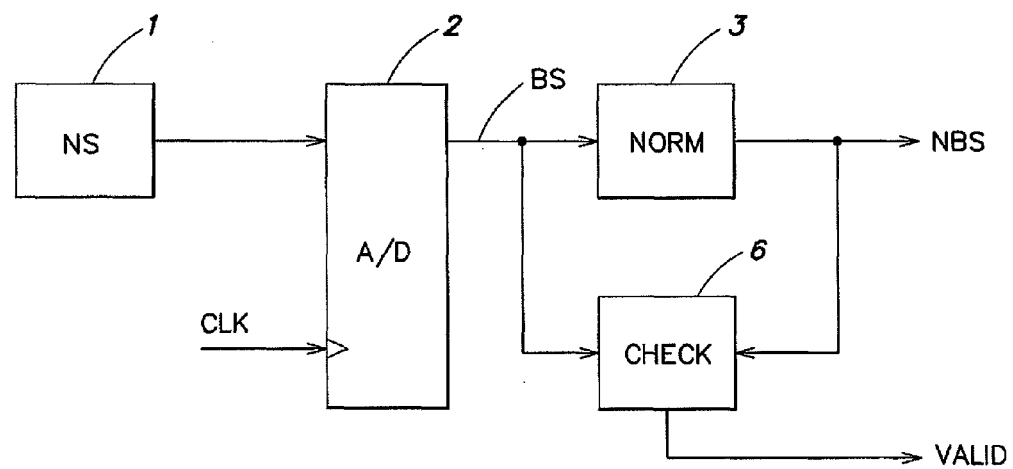
FIG. 4 very schematically shows in the form of blocks another embodiment of a circuit for validating the random character of a bit flow according to the present invention.

A first solution, shown in FIG. 4, is to check the constancy of the flow rate of the normalization circuit. In particular, if the input flow rate is constant, the fact of having a constant bit flow rate at the normalizer output effectively means, especially for a normalizer of the Von Neumann type, a regular frequency of occurrences of pairs 00 and 11. To take into account a possible variation of the input flow rate, the ratio of the number of output bits (flow NBS) to the number of input bits (BS) can be calculated. As shown in FIG. 4, the constancy of the ratio of the rate of the output flow NBS to the input flow BS is checked (block 6, CHECK). If this ratio is constant along time, this means that the noise source drift (skew) is also constant and that, accordingly, the results of the normalization circuit are reliable. As an alternative, the inverse ratio and more generally any function checking the flow rate difference between flows BS and NBS can be calculated.

This first solution already is an improvement with respect to the absence of any solution to detect a possible drift. However, an imperfection is that, over a short period, it is not possible to know whether a change in the ratio between the numbers of output and input bits results from a change in the skew of the noise source causing an inefficiency of the normalization circuit, or in a specific structure of the input bit flow (for example, too long a sequence of states 00) which is then not disturbing (at least as concerns the normalizer efficiency), and which is as probable as another bit sequence.

According to a preferred embodiment of the present invention, the equiprobable character of the bit flow provided by a normalization circuit is validated, by analyzing the ratio between the respective rates of this flow and of another flow generated by a parallel normalization circuit. In other words, it is provided to process the bit flow provided by an analog-to-digital converter by two normalization circuits in parallel to check that the skew of the input noise source is effectively constant.

According to this embodiment of the present invention, the two normalization circuits are selected to be different from each other in terms of flow rate. This means that the respective average values of the ratios between the number of generated bits and the number of input bits are different.

Figure 3:
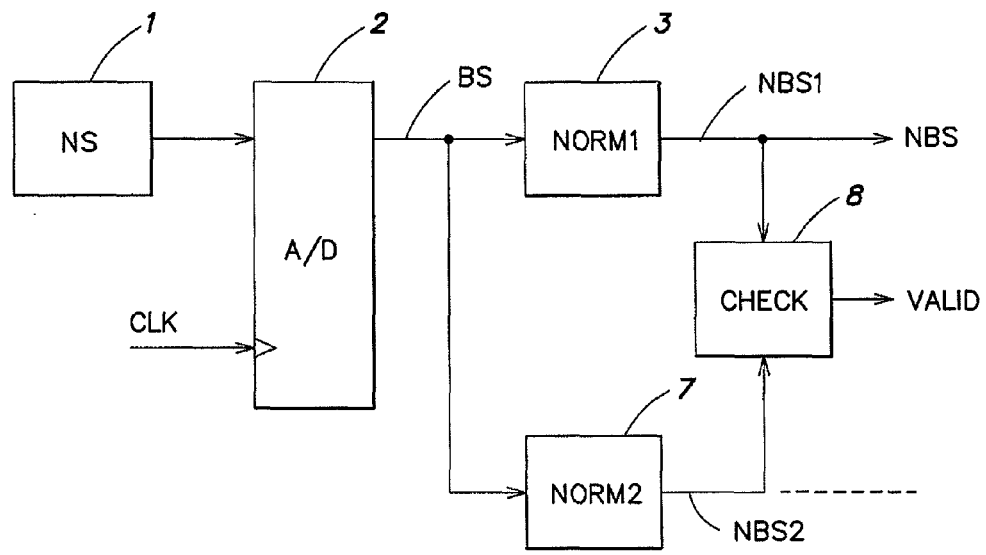
FIG. 3 very schematically shows in the form of blocks an embodiment of a circuit for validating the random character of a bit flow according to the present invention.

FIG. 3 very schematically shows in the form of blocks an embodiment of a circuit for generating a random bit flow implementing the present invention.

As previously, a noise source 1 (NS), for example, analog, provides a converter 2 (A/D) with an analog signal which, by being for example sampled by a clock signal CLK, becomes a bit train BS.

According to this embodiment of the present invention, flow BS is sent, in parallel, onto a first normalization circuit 3 (NORM1) providing a first normalized bit flow NBS1 and onto a second normalization circuit 7 (NORM2) providing a second normalized bit flow NBS2.

Normalization circuits 3 and 7 may implement any conventional normalization method (Von Neumann or other) provided that, for the same input bit flow, the ratio between the number of generated bits and the number of input bits are different from one circuit to the other. For example, a first normalization element processes the bits by pairs and provides a 1 for each pair 1-0 and a 0 for each pair 0-1 without changing the states of the other pairs. A second normalization element processes the bits by triplets and provides a 1 for each triplet 1-0-1 and a 0 for each triplet 0-1-1 without changing the states of the other triplets.

According to this embodiment of the present invention, it is checked (block 8, CHECK) that the difference between the rates of flows NBS1 and NBS2 remains within a predetermined range considered as acceptable. For example, the ratio between the rates of flow NBS1 and NBS2 (or the inverse ratio) is calculated and it is checked (by value comparisons) whether this ratio remains within a predetermined range of values.

If this ratio remains constant (in the predetermined range), this means that the two normalization circuits modify input flow BS by maintaining the skew of the noise source constant and, accordingly, that any one of output bit flows NBS1 and NBS2 has an equiprobable character. In the example of FIG. 3, the flow of first normalizer NBS1 is that providing flow NBS of the random generator.

However, if noise source 1 has a non-constant skew, the two normalization circuits will modify the bit flow but, since they have different flow rates, without modifying the non-constant character of input flow BS. Accordingly, the ratio between the flow rates does not remain constant.

According to an example of embodiment, block 8 provides a state bit VALID indicative of the constancy of the ratio between the rates of flows NBS1 and NBS2. In practice, an acceptable range of variation of the production ratio of the two normalization circuits will be provided. Indeed, the period over which the ratio between the flow rates of the two normalization circuits must be compatible with the provision, by the normalization circuit, of a random bit flow.

According to a specific example of embodiment, a period of examination of the normalization ratios of 32 bits is provided.

The exploitation of the result of block 5 depends on the application. For example, if the ratio varies, the generated bit flow is not used since this means that the bits are not satisfactorily equidistributed.

Of course, the present invention is likely to have various alterations, modifications, and improvements which will readily occur to those skilled in the art. In particular, the selection of the normalization circuit to be used depends on the application which may condition the use of one normalization circuit type rather than another.

Further, the practical implementation of the present invention, be it by hardware and/or software means, is within the abilities of those skilled in the art based on the functional indications given hereabove. For example, the flow rate calculation is performed by means of counters of the numbers of bits generated over a predetermined period, the results of the counters being ratioed at the end of each period, then reset. The ratios may be calculated with a different periodicity (greater) than the counter reset period.

Moreover, although the present invention has been described in relation with a normalization circuit of Von Neumann type exploiting the bit pairs, it more generally applies whatever the length (even or odd) of the incoming words or flow sections considered by the normalization circuits. For example, the incoming bits may be processed four by four.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for generating a bit flow based on a noise source and on at least one first element for normalizing the initial bit flow provided by this noise source, comprising:
    at least one second normalization element of the same noise source, of a different flow rate than the first element; and
    an element for calculating the difference between the respective flow rates of the two normalization elements.

2. The circuit of claim 1, providing a bit for validating the equiprobable character of the output flow if said difference between the two flow rates remains within a predetermined range of values.

3. A method for detecting a loss in equiprobable character of a first output bit flow originating from at least one first element of normalization of an initial bit flow, said method comprising:
    submitting the initial flow to at least one second flow rate normalization element different from the first one; and
    checking constancy of a difference between respective output flow rates of the first and second normalization elements in a checking circuit and providing a signal indicative of the constancy of the difference between the respective output flow rates and thereby indicative of the equiprobable character of the first output flow.

4. The method of claim 3, comprising checking the constancy of the ratio of the rates of the output flow to the initial flow.

5. A method for generating a bit flow, comprising:
    normalizing an input bit flow in a first normalization circuit to provide a first normalized bit flow at a first flow rate, the first normalized bit flow constituting an output bit flow;
    normalizing the input bit flow in a second normalization circuit different from the first normalization circuit to provide a second normalized bit flow at a second flow rate;
    checking constancy of a difference between the first flow rate and the second flow rate; and
    generating a valid signal if the constancy of the difference between the first flow rate and the second flow rate is acceptable.

6. A method as defined in claim 5, wherein generating the valid signal comprises generating a valid signal if the difference between the first flow rate and the second flow rate remains within a predetermined range.

7. A method as defined in claim 5, wherein normalizing the input bit flow in first and second normalization circuits comprises generating the first normalized bit flow and the second normalized bit flow such that the ratio between the number of generated bits and the number of input bits is different from the first normalization circuit to the second normalization circuit.

8. A method as defined in claim 5, wherein checking constancy of the difference between the first flow rate and the second flow rate comprises counting a first number of bits generated by the first normalization circuit over a predetermined period, counting a second number of bits generated by the second normalization circuit over the predetermined period and calculating the ratio between the first number of bits and the second number of bits.

9. A circuit for generating a bit flow, comprising:
    a first normalization circuit configured to normalize an input bit flow to provide a first normalized bit flow at a first flow rate, the first normalized bit flow constituting an output bit flow;
    a second normalization circuit different from the first normalization circuit, wherein the second normalization circuit is configured to provide a second normalized bit flow at a second flow rate ; and
    a checking circuit configured to check a constancy of a difference between the first flow rate and the second flow rate and to generate a valid signal if the constancy of the difference between the first flow rate and the second flow rate is acceptable.

10. A circuit for generating a bit flow as defined in claim 9, wherein the checking circuit is configured to generate the valid signal if the difference between the first flow rate and the second flow rate remains within a predetermined range.

11. A circuit for generating a bit flow as defined in claim 9, wherein the first normalization circuit and the second normalization circuit are configured to generate the first normalized bit flow and the second normalized bit flow, respectively, such that a ratio between a number of generated bits and a number of input bits is different from the first normalization circuit to the second normalization circuit.

12. A circuit for generating a bit flow as defined in claim 9, wherein the checking circuit is configured to count a first number of bits generated by the first normalization circuit over a predetermined period, to count a second number of bits generated by the second normalization circuit over the predetermined period and to calculate a ratio between the first number of bits and the second number of bits.

* * * * *